United States Patent
Ikeda et al.

(10) Patent No.: US 10,084,442 B2
(45) Date of Patent: Sep. 25, 2018

(54) SEMICONDUCTOR DEVICE

(71) Applicant: Kabushiki Kaisha Toshiba, Minato-ku (JP)

(72) Inventors: Kentaro Ikeda, Kawasaki (JP); Takenori Yasuzumi, Yokohama (JP); Kohei Hasegawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/698,968

(22) Filed: Sep. 8, 2017

(65) Prior Publication Data
US 2018/0013415 A1    Jan. 11, 2018

Related U.S. Application Data

(63) Continuation of application No. PCT/JP2015/070332, filed on Jul. 15, 2015, and a
(Continued)

(51) Int. Cl.
*H03K 17/081* (2006.01)
*H01L 29/20* (2006.01)
(Continued)

(52) U.S. Cl.
CPC ...... *H03K 17/08104* (2013.01); *H01L 23/528* (2013.01); *H01L 29/2003* (2013.01);
(Continued)

(58) Field of Classification Search
CPC .............................. H03K 17/08104
See application file for complete search history.

(56) References Cited

U.S. PATENT DOCUMENTS 8,766,275 B2    7/2014   Iketani et al.
8,847,235 B2    9/2014   Rose
(Continued)

FOREIGN PATENT DOCUMENTS

JP    1-228319      9/1989
JP    2008-235952   10/2008
(Continued)

OTHER PUBLICATIONS

International Search Report dated Oct. 6, 2015 in PCT/JP2015/070332, filed on Jul. 15, 2015.
(Continued)

*Primary Examiner* — Jeffrey Zweizig
(74) *Attorney, Agent, or Firm* — Oblon, McClelland, Maier & Neustadt, L.L.P.

(57) ABSTRACT

A semiconductor device according to an embodiment includes a normally-off transistor having a first source, a first drain, and a first gate; a normally-on transistor having a second source electrically connected to the first drain, a second drain, and a second gate, a capacitor having a first end and a second end, the second end being electrically connected to the second gate, a first diode having a first anode electrically connected between the second end and the second gate and having a first cathode electrically connected to the second source, a first resistor provided between the first end and the first gate, and a second diode having a second anode electrically connected to the first end and having a second cathode electrically connected to the first gate, the second diode being provided in parallel with the first resistor.

16 Claims, 19 Drawing Sheets

Related U.S. Application Data continuation of application No. PCT/JP2016/070905, filed on Jul. 14, 2016.

(51) Int. Cl.
  *H01L 23/528* (2006.01)
  *H01L 29/78* (2006.01)
  *H01L 29/872* (2006.01)
  *H01L 29/778* (2006.01)

(52) U.S. Cl.
  CPC ........ *H01L 29/778* (2013.01); *H01L 29/7827* (2013.01); *H01L 29/872* (2013.01)

(56) References Cited

U.S. PATENT DOCUMENTS

| | | | |
|---|---|---|---|
| 9,142,544 B2* | 9/2015 | Ikeda | .................. H01L 27/0255 |
| 9,679,880 B2* | 6/2017 | Ikeda | ...................... H01L 25/18 |
| 2011/0199148 A1 | 8/2011 | Iwamura | |
| 2012/0087167 A1 | 4/2012 | Kuzumaki et al. | |
| 2012/0241756 A1 | 9/2012 | Zhang et al. | |
| 2014/0027785 A1 | 1/2014 | Rose | |
| 2014/0284662 A1 | 9/2014 | Ikeda | |
| 2014/0346570 A1 | 11/2014 | Ueno | |
| 2016/0142050 A1 | 5/2016 | Iketani et al. | |

FOREIGN PATENT DOCUMENTS

| | | |
|---|---|---|
| JP | 2011-10487 | 1/2011 |
| JP | 2012-212875 | 11/2012 |
| JP | 2014-187726 | 10/2014 |
| JP | 2014-229755 | 12/2014 |
| WO | WO 2011/089837 A1 | 7/2011 |
| WO | WO 2015/015899 A1 | 2/2015 |

OTHER PUBLICATIONS

International Search Report dated Oct. 4, 2016 in PCT/JP2016/070905, filed on Jul. 14, 2016.

* cited by examiner

SEMICONDUCTOR DEVICE

CROSS-REFERENCE TO RELATED APPLICATION

This application is continuation application of, and claims the benefit of priority from the International Application PCT/JP2015/070332, filed Jul. 15, 2015, and, the International Application PCT/JP2016/070905, filed Jul. 14, 2016, the entire contents of which are incorporated herein by reference.

FIELD

Embodiments described herein relate generally to a semiconductor device.

BACKGROUND

Group III nitrides such as gallium nitride (GaN) based semiconductors are expected as a material for next generation power semiconductor devices. A GaN-based semiconductor has a wider bandgap compared with silicon (Si). For this reason, GaN-based semiconductor devices can realize higher breakdown voltage and lower loss than silicon (Si) semiconductor devices.

Generally, in a GaN-based transistor, a high electron mobility transistor (HEMT) structure using a two dimensional electron gas (2DEG) as a carrier is applied. A normal HEMT is a normally-on transistor which conducts without a voltage applied to the gate. Accordingly, there is a problem that it is difficult to realize a normally-off transistor that does not conduct unless a voltage is applied to the gate.

A power supply circuit, or the like, that deals with large electric power of several hundred V to 1000 V demands normally-off operation with emphasis on safety. Accordingly, a circuit configuration that realizes normally-off operation by cascode-connecting a normally-on GaN-based transistor with a normally-off Si transistor is proposed.

However, such a circuit configuration includes a problem of element breakdown and characteristic degradation when an over voltage occurs at a connecting portion between the two transistors.

DETAILED DESCRIPTION

Figure 1:
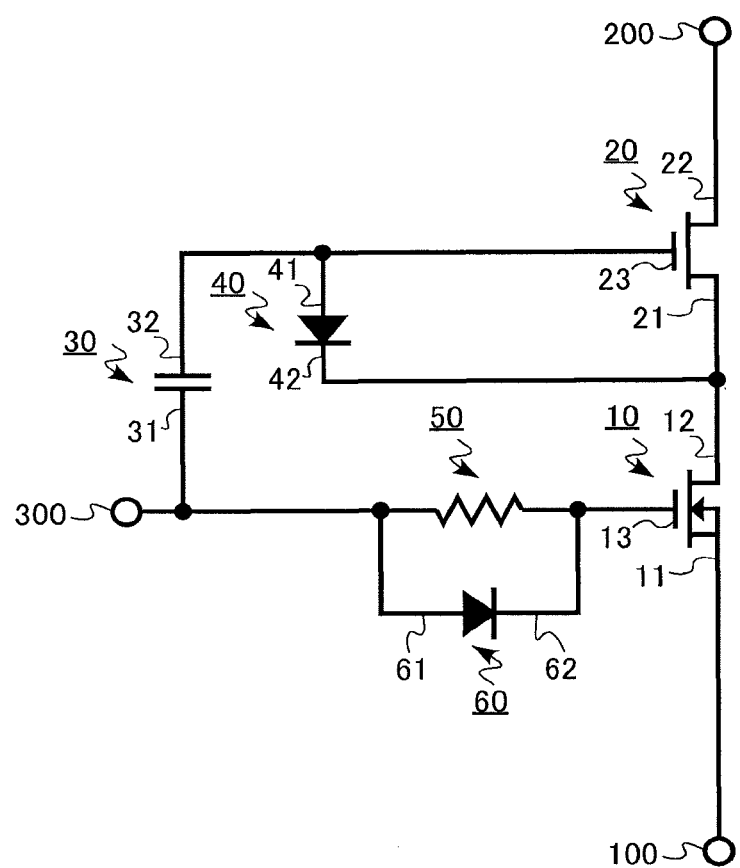
FIG. 1 is a circuit diagram of a semiconductor device according to a first embodiment.

A semiconductor device according to an embodiment includes: a normally-off transistor having a first source, a first drain, and a first gate; a normally-on transistor having a second source electrically connected to the first drain, a second drain, and a second gate; a capacitor having a first end and a second end, the second end being electrically connected to the second gate; a first diode having a first anode electrically connected between the second end and the second gate and having a first cathode electrically connected to the second source; a first resistor provided between the first end and the first gate; and a second diode having a second anode electrically connected to the first end and having a second cathode electrically connected to the first gate, the second diode being provided in parallel with the first resistor.

Hereinafter, embodiments of the present invention will be described with reference to the drawings. Note that, in the following description, the same reference numerals are attached to the same or similar members in some cases. Moreover, as for the once described members, or the like, explanation thereof will be omitted as appropriate.

Moreover, in the present description, a semiconductor device refers to a concept including a power module combining a plurality of elements such as discrete semiconductors with each other, an intelligent power module incorporating, in the plurality of elements such as discrete semiconductors, a drive circuit for driving these elements and a self-protection function, or a whole system including the power module and the intelligent power module.

Moreover, in the present specification, the "GaN-based semiconductor" is a generic term for semiconductors having gallium nitride (GaN), aluminum nitride (AlN), indium nitride (InN) and intermediate compositions thereof.

First Embodiment

A semiconductor device according to an embodiment includes: a normally-off transistor having a first source, a first drain, and a first gate; a normally-on transistor having a second source electrically connected to the first drain, a second drain, and a second gate; a capacitor having a first end and a second end, the second end being electrically connected to the second gate; a first diode having a first anode electrically connected between the capacitor and the second gate and having a first cathode electrically connected to the second source; a first resistor provided between the first end and the first gate; and a second diode having a second anode electrically connected to the first end and having a second cathode electrically connected to the first gate, the second diode being provided in parallel with the first resistor.

FIG. 1 is a circuit diagram of a semiconductor device according to the present embodiment. The semiconductor device according to the present embodiment is, for example, a power module having a rated voltage of 600 V or 1200 V.

The semiconductor device according to the present embodiment includes a normally-off transistor 10, a normally-on transistor 20, a capacitor 30, a first diode 40, a first resistor 50, and a second diode 60. Moreover, the semiconductor device includes a source terminal 100, a drain terminal 200, and a gate terminal 300.

In the semiconductor device according to the present embodiment, the normally-off transistor 10 and the normally-on transistor 20 are connected in series to form a power module.

The normally-off transistor 10 is a transistor that does not conduct unless a voltage is applied to the gate. The normally-off transistor 10 is, for example, a vertical metal oxide semiconductor field effect transistor (MOSFET) using a silicon (Si) semiconductor.

Moreover, the normally-on transistor 20 is a transistor that conducts even when no voltage is applied to the gate. The normally-on transistor 20 is, for example, a HEMT using a gallium nitride (GaN)-based semiconductor. The normally-on transistor 20 includes a gate insulating film.

The normally-off transistor 10 includes a parasitic body diode (not illustrated).

The normally-off transistor 10 has a lower element breakdown voltage compared with the normally-on transistor 20. The element breakdown voltage of the normally-off transistor 10 is, for example, 10 V to 30 V. The element breakdown voltage of the normally-on transistor 20 is, for example, 600 V to 1200 V.

The normally-off transistor 10 includes a first source 11, a first drain 12, and a first gate 13. The normally-on transistor 20 includes a second source 21, a second drain 22, and a second gate 23.

The first source 11 is electrically connected to the source terminal 100. The first drain 12 is electrically connected to the second source 21. The first gate 13 is electrically connected to the gate terminal 300.

The second source 21 is electrically connected to the first drain 12. The second drain 22 is electrically connected to the drain terminal 200. The second gate 23 is electrically connected to the gate terminal 300. Hereinafter, a region in which the first drain 12 and the second source 21 are connected with each other will be referred to as a connecting portion.

The capacitor 30 includes a first end 31 and a second end 32. The capacitor 30 is provided between the gate terminal 300 and the second gate 23. The first end 31 is electrically connected to the gate terminal 300. Moreover, the second end 32 is electrically connected to the second gate 23.

The first diode 40 includes a first anode 41 and a first cathode 42. The first anode 41 is electrically connected between the second end 32 of the capacitor 30 and the second gate 23. Moreover, the first cathode 42 is electrically connected to the second source 21.

The first diode 40 is, for example, a PiN diode or a Schottky barrier diode.

The first resistor 50 is provided between the first end 31 of the capacitor 30 and the first gate 13. One end of the first resistor 50 is electrically connected to the gate terminal 300. The other end of the first resistor 50 is electrically connected to the first gate 13.

The second diode 60 includes a second anode 61 and a second cathode 62. The second anode 61 is electrically connected to the first end 31 of the capacitor 30. The second cathode 62 is electrically connected to the first gate 13. The second diode 60 is provided in parallel with the first resistor 50.

The second diode 60 is, for example, a PiN diode or a Schottky barrier diode.

Next, a function and an effect of the semiconductor device according to the present embodiment will be described. The semiconductor device according to the present embodiment functions as a normally-off transistor including the source terminal 100, the drain terminal 200, and the gate terminal 300, with the above-described configuration. Hereinafter, operation of the semiconductor device according to the present embodiment will be described.

During operation of the device, there is a possibility of occurrence of over voltage at the connecting portion between the normally-off transistor 10 and the normally-on transistor 20, that is, the first drain 12 of the normally-off transistor 10 or the second source 21 of the normally-on transistor 20. The over voltage can occur, for example, when a transient current occurs when the semiconductor device shifts from an on state to an off state, and then, the high voltage applied between the source terminal 100 and the drain terminal 200 is divided with a ratio of the parasitic capacitance between the normally off transistor 10 and normally-on transistor 20.

When an over voltage occurs, a high voltage is applied between the second source 21 and the second gate 23 of the normally-on transistor 20. When the over voltage increases to the breakdown voltage of the gate insulating film, or more, a leakage current of the gate insulating film of the normally-on transistor 20 might increase, or the gate insulating film might be broken. Increase in the leakage current of the gate insulating film of the normally-on transistor 20 or breakdown of the gate insulating film causes malfunction of the semiconductor device. This would decrease reliability of the semiconductor device.

Moreover, even when no problem occurs in the gate insulating film, application of a high voltage between the second source 21 and the second gate 23 of the normally-on transistor 20 causes a charge to be trapped to the second source 21-side of the normally-on transistor 20. The trapped charge leads to current collapse.

Current collapse decreases an on-current, resulting in malfunctioning. This also decreases reliability of the semiconductor device. To cope with this, it is desirable to suppress generation of over voltage at the connecting portion.

In the semiconductor device according to the present embodiment, in the on state, the voltage applied to the source terminal 100 is 0 V and the voltage applied to the drain terminal 200 is a positive voltage, for example, the product of the on-resistance and the drain current. In addition, the voltage applied to the gate terminal 300 is a positive voltage, for example 10 V.

At this time, a positive voltage is applied to the first gate 13 of the normally-off transistor 10. This turns on the normally-off transistor 10.

The second gate 23 of the normally-on transistor 20 is connected to the connecting portion between the second source 21 and the first drain 12 via the first diode 40. Since the normally-off transistor 10 is turned on, the second source 21 has a potential in the vicinity of 0 V. Accordingly, the voltage at the second gate 23 is a positive voltage in the vicinity of 0V, more specifically, a voltage obtained by adding a forward drop voltage (Vf) of the first diode 40 to the voltage of the second source 21. This also turns on the normally-on transistor 20. As a result, an on-current flows between the source terminal 100 and the drain terminal 200.

It is desirable that the normally-off transistor 10 is turned on earlier than the normally-on transistor 20 when the semiconductor device shifts from the off state to the on state. The reason is turning on the normally-on transistor 20 first might apply a high voltage to the connecting portion between the first drain 12 and the second source 21, and might lead to degradation of the characteristics of the normally-off transistor 10 having low breakdown voltage.

In the present embodiment, when the semiconductor device shifts from the off state to the on state, the current flows through the second diode 60 provided in parallel with the first resistor 50. Therefore, charging of the first gate 13 of the normally-off transistor 10 is not affected by the first resistor 50. Accordingly, the first gate 13 can be quickly charged. As a result, when the semiconductor device shifts from the off state to the on state, the normally-off transistor 10 can be reliably turned on earlier than the normally-on transistor 20.

Next, a case where the semiconductor device is turned from the on state to the off state will be considered. In this case, the voltages applied to the source terminal 100 and the drain terminal 200 do not change, and the voltage applied to the gate terminal 300 drops from a positive voltage to 0 V, for example, from 10 V to 0 V.

Due to the presence of the capacitor 30, the potential decreases by the amplitude of the gate terminal 300 in the second gate 23 of the normally-on transistor 20. For example, it is assumed that the voltage when the second source 21 is on is 0 V. In this case, the potential of the second gate 23 decreases from the forward drop voltage (Vf) of the first diode 40 by the amplitude of the gate terminal 300, for example, 10 V, and becomes a negative potential of (Vf–10) V.

Then, the voltage between the second source 21 and the second gate 23 becomes a threshold voltage or less of the normally-on transistor 20, thereby turning off the normally-on transistor 20.

The voltage applied to the first gate 13 of the normally-off transistor 10 is 0 V. This also turns off the normally-off transistor 10. Accordingly, the current between the source terminal 100 and the drain terminal 200 is interrupted.

By providing the first resistor 50, the off-timing of the normally-off transistor 10 and the off-timing of the normally-on transistor 20 can be delayed by a desired time. Accordingly, when the semiconductor device shifts from the on state to the off state, the normally-on transistor 20 is turned off earlier than the normally-off transistor 10.

Since the normally-on transistor 20 is turned off earlier than the normally-off transistor 10, application of over voltage to the connecting portion is suppressed. This is because, turning the normally-on transistor 20 off first enables a charge to be released to the source terminal 100 by the normally-off transistor 10 which is turned on, even when the potential of the connecting portion increases due to a transient current.

As described above, the semiconductor device according to the present embodiment functions as a normally-off transistor including the source terminal 100, the drain terminal 200, and the gate terminal 300.

Furthermore, as described above, in the semiconductor device according to the present embodiment, the normally-off transistor 10 is turned on earlier than the normally-on transistor 20 when the semiconductor device shifts from the off state to the on state. Moreover, when the semiconductor device shifts from the on state to the off state, the normally-on transistor 20 is turned off earlier than the normally-off transistor 10. Accordingly, the occurrence of high voltage or over voltage at the connecting portion between the normally-off transistor 10 and the normally-on transistor 20 is suppressed. As a result, reliability of the semiconductor device is enhanced.

Figure 2:
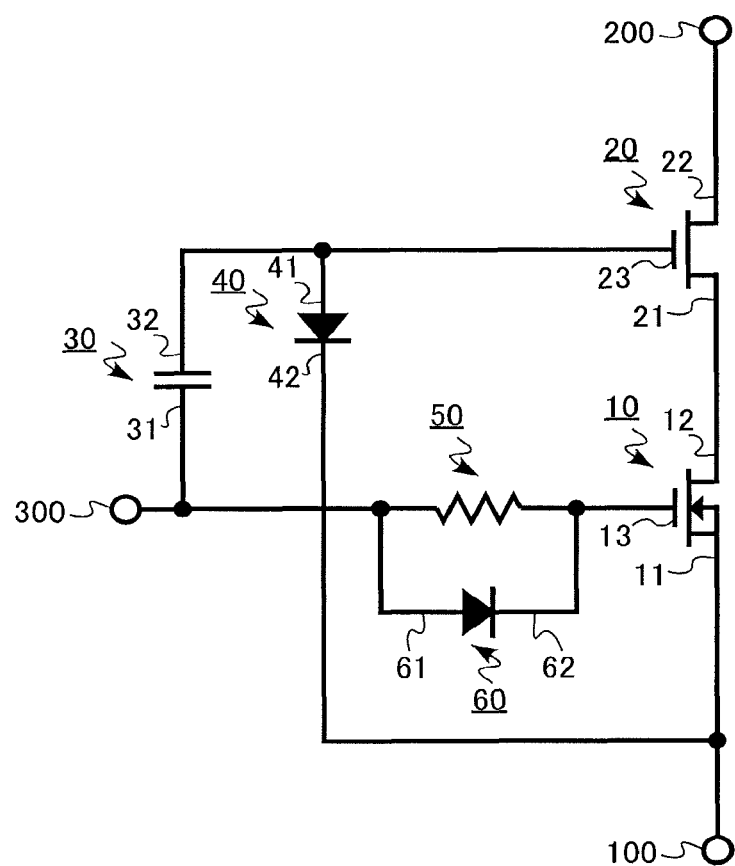
FIG. 2 is a circuit diagram of a semiconductor device of a comparative embodiment.

FIG. 2 is a circuit diagram of a semiconductor device in a comparative embodiment. The semiconductor device in the comparative embodiment is different from the semiconductor device according to the present embodiment in that the first cathode 42 of the first diode 40 is electrically connected to the first source 11 instead of the second source 21. In the comparative embodiment, the first cathode 42 is clamped to the source terminal 100.

Also in the case of the semiconductor device of the comparative embodiment, the normally-on transistor 20 is turned off earlier than the normally-off transistor 10 when the semiconductor device shifts from the on state to the off state, similarly to the present embodiment. Accordingly, occurrence of over voltage is suppressed at the connecting portion between the normally-off transistor 10 and the normally-on transistor 20.

In the semiconductor device in the comparative embodiment, there is a possibility of occurrence of an over voltage at the connecting portion when the power supply is turned on. In the present embodiment, the first diode 40 is connected to the connecting portion. Accordingly, the parasitic capacitance of the connecting portion is larger than the case of the comparative embodiment. Accordingly, occurrence of an over voltage at the connecting portion at the time of turning on the power supply to the semiconductor device is suppressed.

In the semiconductor device in the comparative embodiment, application of a positive surge voltage (current) to the second gate 23 might cause a high voltage to be applied between the second source 21 and the second gate 23, and might break the gate insulating film of the normally-on transistor 20. In the semiconductor device according to the present embodiment, a positive charge that enters the second gate 23 passes through the first diode 40 and flows directly into the second source 21. This suppresses application of a high voltage between the second source 21 and the second gate 23.

According to the investigation of the inventors, it has become clear that, in the GaN-based semiconductor HEMT, the breakdown voltage of the gate insulating film is remarkably lower in a case where the gate is positively biased than the case where the gate is negatively biased. Accordingly, the semiconductor device according to the present embodiment is effective especially in a case where the normally-on transistor 20 is a GaN-based semiconductor HEMT.

Moreover, unlike the semiconductor device of the comparative embodiment, the semiconductor device according to the present embodiment is configured such that the wiring connected to the first cathode 42 of the first diode 40 does not intersect with other wiring. Accordingly, when mounting the semiconductor device according to the present embodiment on a circuit board, or the like, mounting can be easily performed.

In the semiconductor device according to the present embodiment, it is desirable that an avalanche breakdown voltage of the normally-off transistor 10 is set to a voltage lower than the breakdown voltage of the gate insulating film of the normally-on transistor 20. With this setting, the breakdown voltage between the first source 11 and the first drain 12 at turn-off of the normally-off transistor is set to a voltage lower than a breakdown voltage between the second source 21 and the second gate 23 of the normally-on transistor.

With this configuration, even when an over voltage occurs at the connecting portion due to a surge, or the like, the avalanche breakdown of the normally-off transistor 10 occurs, making it possible to release the charge at the connecting portion. Accordingly, it is possible to set the voltage applied between the second source 21 and the second gate 23 of the normally-on transistor 20 to be lower than the breakdown voltage of the gate insulating film of the normally-on transistor 20.

Accordingly, this prevents an increase in the leakage current of the gate insulating film of the normally-on transistor 20 and breakdown of the gate insulating film. This also prevents current collapse. As a result, reliability of the semiconductor device is enhanced.

Note that, in general, the breakdown voltage of the gate insulating film of the normally-on transistor 20 exceeds 30 V in a case where the gate is negatively biased. Accordingly, the avalanche breakdown voltage of the normally-off transistor 10 is desirably 30 V or less.

Moreover, it is desirable that the avalanche breakdown voltage of the normally-off transistor 10 is sufficiently higher than the absolute value of a threshold voltage (Vth) of the normally-on transistor 20. This is to ensure that the normally-on transistor 20 can be reliably turned off. From this viewpoint, it is desirable that the avalanche breakdown voltage of the normally-off transistor 10 is the absolute value +5 V of the threshold voltage (Vth) of the normally-on transistor 20, or more. In a case where Vth=−10 V, it is desirable that the avalanche breakdown voltage of the normally-off transistor 10 is 15 V or more.

It is desirable that the capacitance of the capacitor 30 is 10 times or more and 100 times or less of an input capacitance of the normally-on transistor 20. The negative voltage applied to the second gate 23 of the normally-on transistor 20 is determined by the ratio of the capacitance of the capacitor 30 and the input capacitance of the normally-on transistor 20. Accordingly, it is desirable that the capacity of the capacitor 30 is larger.

In a case where the capacitance of the capacitor 30 is 10 times or more the input capacitance of the normally-on transistor 20, it is possible to apply 90% or more of the amplitude applied to the gate terminal 300. On the other hand, when the capacitance exceeds 100 times, the capacitor becomes too large, leading to a concern of enlargement of the semiconductor device.

Note that the input capacitance of the normally-on transistor 20 is the sum of the capacitance between the second gate 23 and the second source 21 and the capacitance between the second gate 23 and the second drain 22. The input capacitance is set as a value when the bias between the second source 21 and the second drain 22 is 0 V and it is in a pinch off state.

Moreover, the first diode 40 is desirably a Schottky barrier diode. When a negative surge voltage (current) is applied to the second gate 23, the voltage between the second source 21 and the second gate 23 falls below the threshold voltage of the normally-on transistor 20, leading to a failure in turning on operation of the transistor 20.

The leakage current of the first diode 40 is solely a path through which the negative charge is released from the second gate 23. Accordingly, the first diode 40 is desirably a Schottky barrier diode having a relatively large leakage current.

The resistance value of the first resistor 50 is desirably 1Ω or more and 100Ω or less. A value below this range might lead to a failure in achieving a significant delay time. A value exceeding this range might prolong the delay time and lower the switching speed of the semiconductor device decreases, and thus, is undesirable.

The product of the input capacitance of the normally-off transistor 10 and the resistance value of the first resistor 50 is desirably larger than 20 nsec. That is, when the input capacitance of the normally-off transistor 10 is C and the resistance value of the first resistor 50 is R, it is desirable to satisfy the following formula (1).

$$CR > 20 \text{ nsec} \qquad (1)$$

In a case where the semiconductor device is switched from the on state to the off state, the time until the normally-on transistor 20 is turned off is about 20 nsec. Accordingly, in order to turn off the normally-on transistor 20 earlier than the normally-off transistor 10, the normally-off transistor 10 needs to be in the on state for more than 20 nsec.

The switching time of the normally-off transistor 10 is determined by the time constant (CR). Accordingly, from the viewpoint of suppressing over voltage at the connecting portion, it is desirable that the above formula (1) is satisfied.

For example, when the input capacitance (C) of the normally-off transistor 10 is 500 pF, the resistance value (R) of the first resistor 50 satisfying the above formula (1) is about 40Ω.

Moreover, it is desirable that the product of the input capacitance (C) of the normally-off transistor 10 and the resistance value (R) of the first resistor is larger than 100 nsec. That is, when the input capacitance of the normally-off transistor 10 is C and the resistance value of the first resistor 50 is R, it is desirable to satisfy the following formula (2).

$$CR > 100 \text{ nsec} \qquad (2)$$

In a case where the semiconductor device is used at a high operating frequency on the order of MHz, it is desirable to keep the normally-off transistor 10 in the on state all the time, including during an off period of the semiconductor device at the time of operation. The reason is, with this operation, charging and discharging of the normally-off transistor 10 is suppressed and a low-loss semiconductor device can be realized.

In order to keep the normally-off transistor 10 in the on state, it would be sufficient to increase the switching time of the normally-off transistor 10. For example, in the case of operating at 5 MHz, with the on-off duty ratio (duty ratio) of 0.5, the off period of the normally off transistor 10 is 100 nsec. Accordingly, from the viewpoint of reducing loss, it is desirable to satisfy the above formula (2).

Note that the input capacitance of the normally-off transistor 10 is the sum of the capacitance between the first gate 3 and the first source 11, and the capacitance between the first gate 13 and the first drain 12. The input capacitance is set as a value when the bias between the first source 11 and the first drain 12 is 0 V and it is in a pinch off state.

With the semiconductor device according to the present embodiment, it is possible to enhance reliability of the normally-off transistor 10 and the normally-on transistor 20 connected in series.

Second Embodiment

The semiconductor device according to the present embodiment is similar to the first embodiment except that a plurality of first diodes is connected in series. Accordingly, descriptions of the content overlapping with the first embodiment will be omitted.

Figure 3:
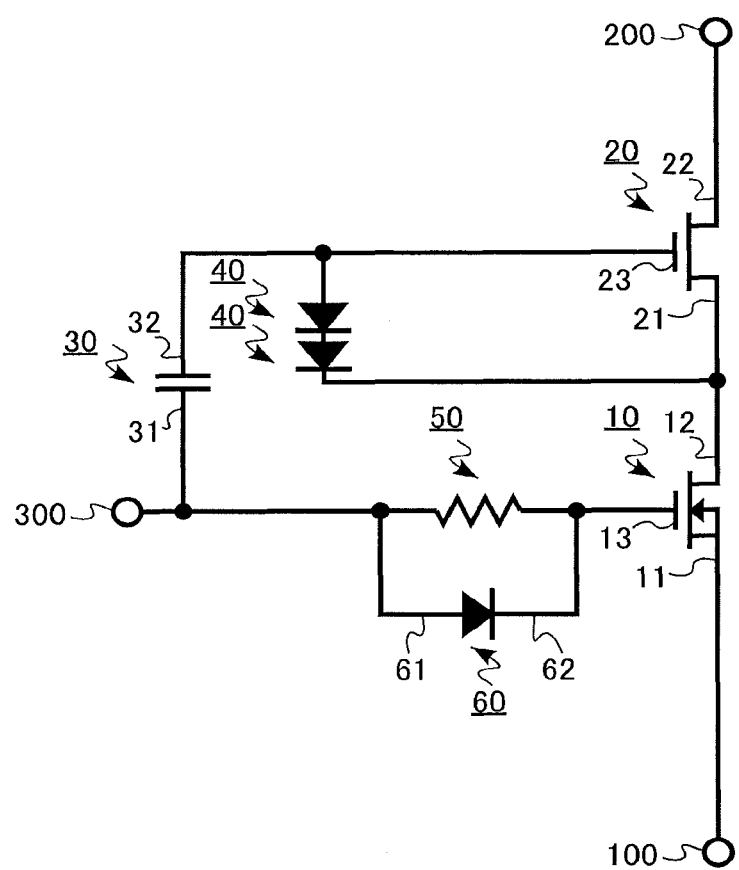
FIG. 3 is a circuit diagram of a semiconductor device according to a second embodiment.

FIG. 3 is a circuit diagram of the semiconductor device according to the present embodiment. The semiconductor device according to the present embodiment includes two first diodes 40 connected in series.

According to the present embodiment, in the on state of the semiconductor device, a voltage obtained by adding the forward drop voltage (Vf)×2 of the first diode 40 to the voltage of the second source 21 is applied to the second gate 23. Accordingly, this makes it possible to overdrive the normally-on transistor 20 and thus to increase the on-current.

While the description is an exemplary case where the two first diodes 40 are connected in series, the number of first diodes 40 connected in series may be three or more. n (n is an integer of two or more), a voltage obtained by adding the voltage of the forward drop voltage (Vf)×n of the first diode 40 to the voltage of the second source 21 is applied to the second gate 23.

According to the present embodiment, it is possible not only to achieve effects of the first embodiment but also to achieve an increase in the on-current.

Third Embodiment

The semiconductor device according to the present embodiment is similar to the first embodiment, except that it further includes a second resistor one end of which is electrically connected between the first end of the capacitor and the first resistor. In other words, the configuration is similar to the first embodiment except that it further includes the second resistor provided between the gate terminal and the capacitor, and between the gate terminal and the first gate. Accordingly, descriptions of the content overlapping with the first embodiment will be omitted.

Figure 4:
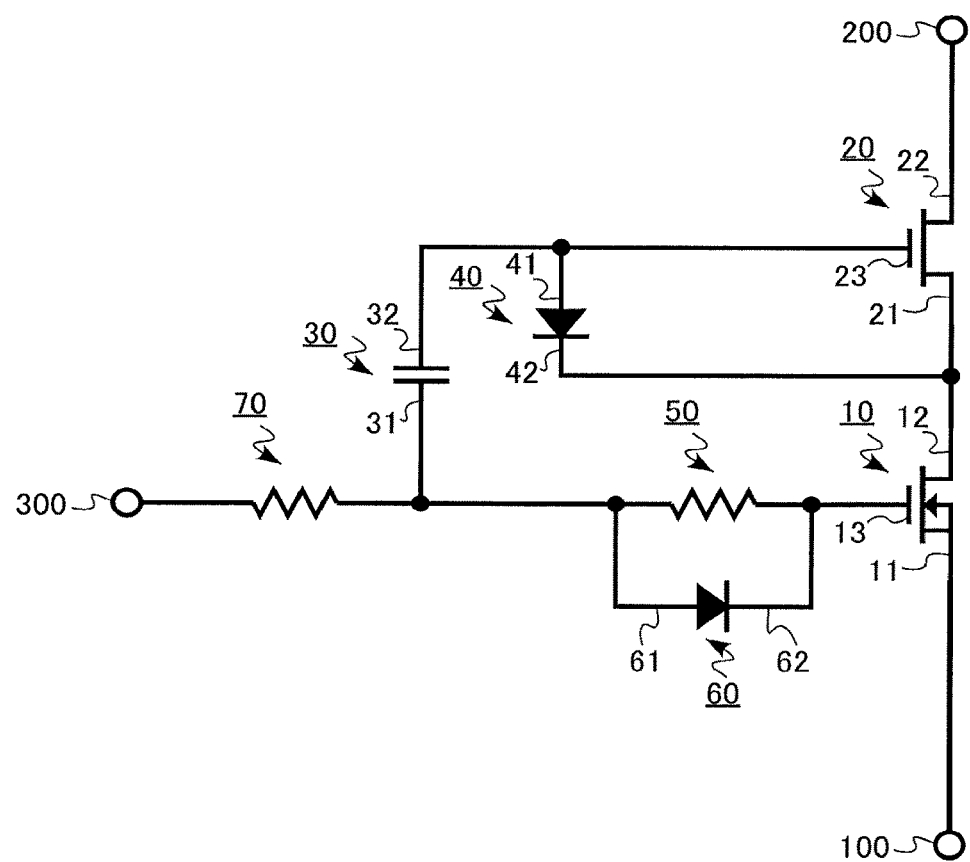
FIG. 4 is a circuit diagram of a semiconductor device according to a third embodiment.

FIG. 4 is a circuit diagram of the semiconductor device according to the present embodiment.

The semiconductor device according to the present embodiment includes a second resistor 70 provided between the gate terminal 300 and the capacitor 30 and between the gate terminal 300 and the first gate 13. One end of the second resistor 70 is electrically connected between the first end 31 of the capacitor 30 and the first resistor 50. Moreover, the other end of the second resistor 70 is connected to the gate terminal 300.

Power electronics circuit design sometimes demands adjustment of the operation speed of the transistor against noise. In the present embodiment, by providing the second resistor 70, it is possible to delay the propagation of the gate voltage applied to the gate terminal 300 to the first gate 13 and the second gate 23. Accordingly, it is possible to adjust the operating speed (switching speed) of the semiconductor device.

According to the present embodiment, it is possible not only to achieve effects of the first embodiment but also to achieve adjustment of operation speed (switching speed) of the semiconductor device.

Fourth Embodiment

The semiconductor device according to the present embodiment is similar to the first embodiment, except that it further includes a third resistor provided between the second end of the capacitor and the second gate. Accordingly, descriptions of the content overlapping with the first embodiment will be omitted.

Figure 5:
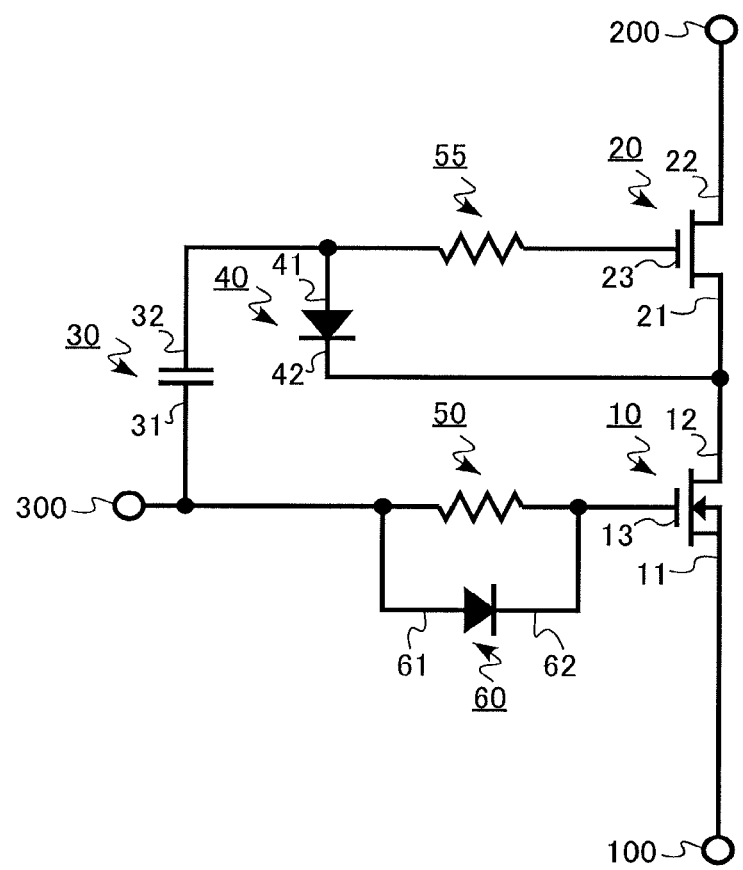
FIG. 5 is a circuit diagram of a semiconductor device according to a fourth embodiment.

FIG. 5 is a circuit diagram of the semiconductor device according to the present embodiment.

The semiconductor device according to the present embodiment includes a third resistor 55 between the second end 32 of the capacitor 30 and the second gate 23.

As described above, power electronics circuit design sometimes demands adjustment of the operation speed of the transistor against noise. In the present embodiment, by providing the third resistor 55, it is possible to delay the propagation of the gate voltage applied to the gate terminal 300 to the second gate 23.

The propagation of the gate voltage to the first gate 13 can be independently adjusted by the first resistor 50 or the second diode 60. Accordingly, it is possible to adjust the operating speed (switching speed) of the semiconductor device.

According to the present embodiment, it is possible not only to achieve effects of the first embodiment but also to achieve adjustment of operation speed (switching speed) of the semiconductor device.

Fifth Embodiment

The semiconductor device according to the present embodiment is similar to the first embodiment except that it includes a Schottky barrier diode having a third anode electrically connected to the first source and a third cathode electrically connected to the first drain. The Schottky barrier diode is configured such that the forward drop voltage is lower than the forward drop voltage of the parasitic body diode of the normally-off transistor. Accordingly, descriptions of the content overlapping with the first embodiment will be omitted.

Figure 6:
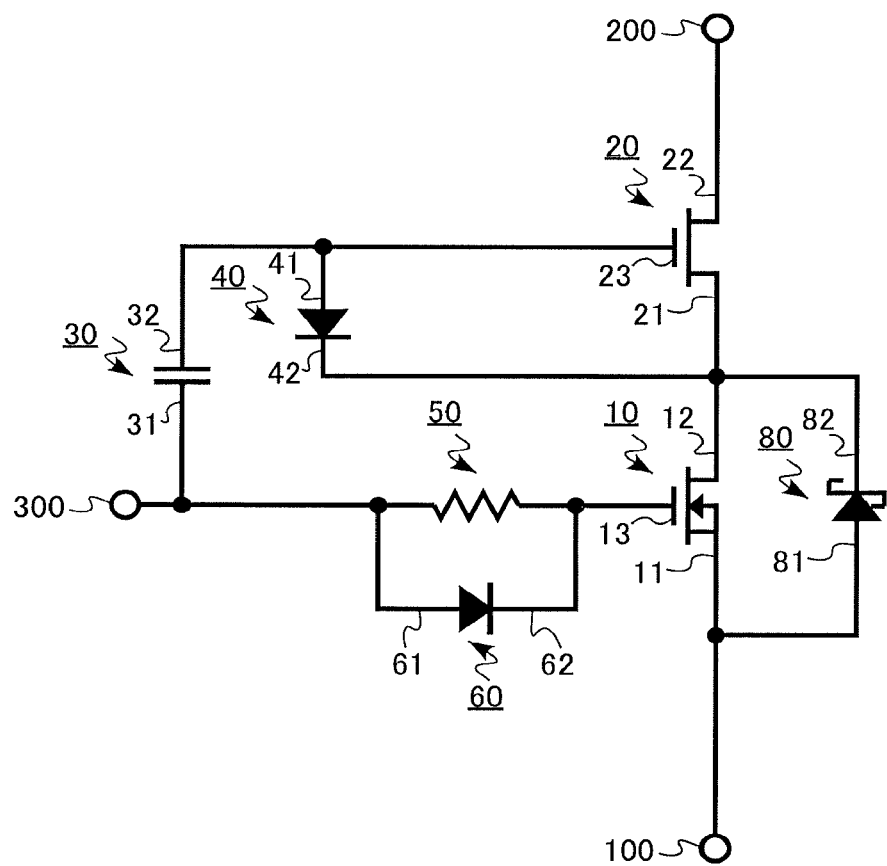
FIG. 6 is a circuit diagram of a semiconductor device according to a fifth embodiment.

FIG. 6 is a circuit diagram of the semiconductor device according to the present embodiment. The semiconductor device according to the present embodiment includes a Schottky barrier diode 80 provided in parallel with the normally-off transistor 10.

The Schottky barrier diode 80 includes a third anode 81 and a third cathode 82. The third anode 81 is connected to the first source 11. Moreover, the third cathode 82 is connected to the first drain 12 and the second source 21.

The forward drop voltage (Vf) of the Schottky barrier diode 80 is lower than the forward drop voltage (Vf) of the parasitic body diode (not illustrated) of the normally-off transistor.

In a case where the Schottky barrier diode 80 is not provided, the current flows through the parasitic body diode of the normally-off transistor 10 in a reflux mode in which the source terminal 100 presents a positive voltage with respect to the drain terminal 200. The present embodiment includes the Schottky barrier diode 80 having the forward drop voltage (Vf) lower than the forward drop voltage (Vf) of the parasitic body diode of the normally-off transistor 10. With this configuration, the current flows through the Schottky barrier diode 80 in the reflux mode.

Unlike the PiN diode, the Schottky barrier diode operates using majority carriers alone. Accordingly, it has better recovery characteristics than the case of the PiN diode. Accordingly, in the present embodiment, it is possible not only to achieve the effects of the first embodiment but also to achieve enhanced recovery characteristics in the reflux mode. Moreover, since the forward drop voltage (Vf) is small, it is also possible to reduce conduction loss and switching loss in the reflux mode.

Moreover, due to the parasitic capacitance of the Schottky barrier diode 80, application of an over voltage due to a surge, or the like, at the connecting portion is suppressed. Moreover, since the leakage current of the Schottky barrier diode 80 allows the charge to be released from the connecting portion, application of over voltage to the connecting portion is suppressed. Accordingly, a semiconductor device with further enhanced reliability is realized. Moreover, due to the leakage current of the Schottky barrier diode 80, a voltage increase in the first drain 12 of the normally-off transistor 10 is also suppressed. Accordingly, stable operation is also realized.

Since the Schottky barrier diode has no avalanche guarantee, it is desirable that the breakdown voltage of the Schottky barrier diode 80 is higher than the avalanche breakdown voltage of the normally-off transistor 10.

Sixth Embodiment

The semiconductor device according to the present embodiment is similar to the first embodiment except that it includes a Zener diode having a fourth anode electrically connected to the first source and having a fourth cathode electrically connected to the first drain. The Zener diode is configured such that a Zener voltage is lower than the breakdown voltage between the second source and the second gate of the normally-on transistor and the Zener voltage is lower than the avalanche breakdown voltage of the normally-off transistor. Accordingly, descriptions of the content overlapping with the first embodiment will be omitted.

Figure 7:
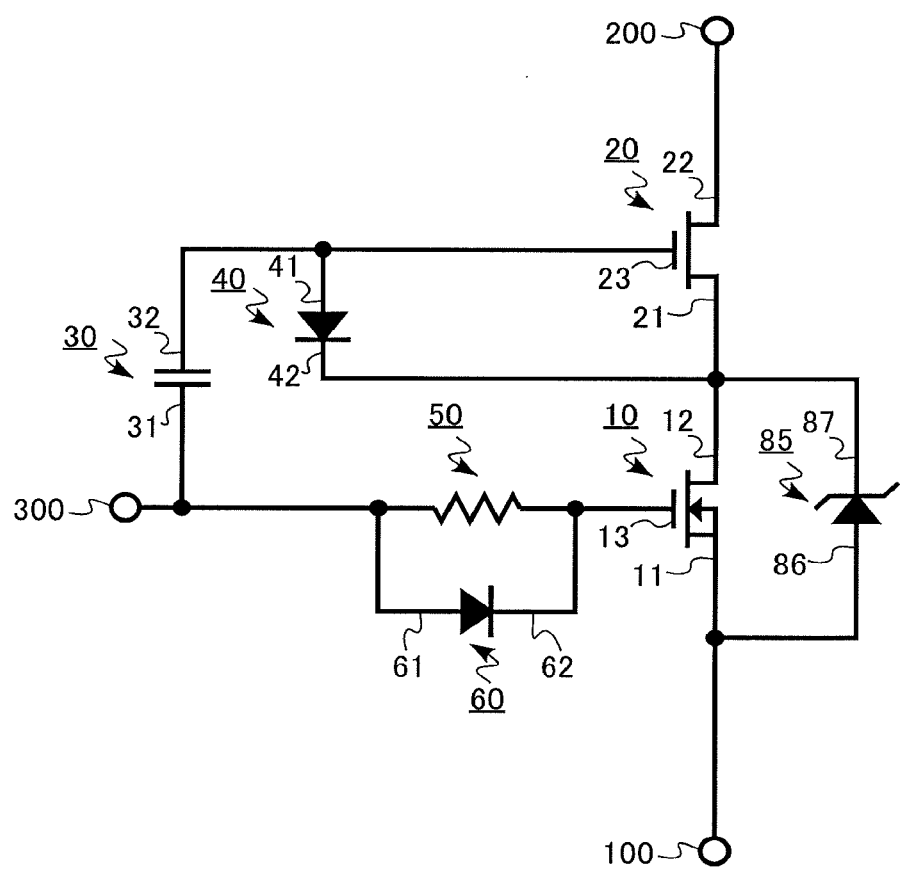
FIG. 7 is a circuit diagram of a semiconductor device according to a sixth embodiment.

FIG. 7 is a circuit diagram of the semiconductor device according to the present embodiment. The semiconductor device according to the present embodiment includes a Zener diode 85 provided in parallel with the normally-off transistor 10.

The Zener diode 85 includes a fourth anode 86 and a fourth cathode 87. The fourth anode 86 is electrically connected to the first source 11. Moreover, the fourth cathode 87 is electrically connected to the first drain 12 and the second source 21.

The Zener voltage of the Zener diode 85 is set to be lower than the avalanche breakdown voltage of the normally-off transistor 10. Moreover, the Zener voltage is set to be lower than the breakdown voltage of the gate insulating film of the normally-on transistor 20. With this arrangement, the breakdown voltage between the first source 11 and the first drain 12 at turn-off of the normally-off transistor 10 is set to a voltage lower than a breakdown voltage between the second source 21 and the second gate 23 of the normally-on transistor 20.

The semiconductor device according to the present embodiment is configured such that, in a case where an over voltage due to a surge, or the like, occurs at the connecting portion of the normally-off transistor 10 and the normally-on transistor 20, the charge is released to the Zener diode 85 and then discharged to the source terminal 100 at a point where the over voltage reaches the Zener voltage. Accordingly, this suppresses voltage increase in the connecting portion and prevents an increase in the leakage current of the gate insulating film of the normally-on transistor 20 and breakdown of the gate insulating film. This also prevents current collapse. As a result, reliability of the semiconductor device is enhanced.

The Zener voltage of the Zener diode 85 can be controlled more accurately than the avalanche breakdown voltage of the normally-off transistor 10. Accordingly, by using the Zener diode 85, the semiconductor device according to the present embodiment makes it possible to suppress the over voltage in the connecting portion further stably. Moreover, even in a case where an unexpected high voltage such as noise is applied to the first drain 12 of the normally-off transistor 10, it is possible to release the charge by the Zener diode 85, and thus to contribute also to protection of the normally-off transistor 10.

Seventh Embodiment

The semiconductor device according to the present embodiment has all the configurations of the first, third, fourth, fifth, and sixth embodiments. Accordingly, descriptions of contents overlapping with the first, third, fourth, fifth and sixth embodiments will be omitted.

Figure 8:
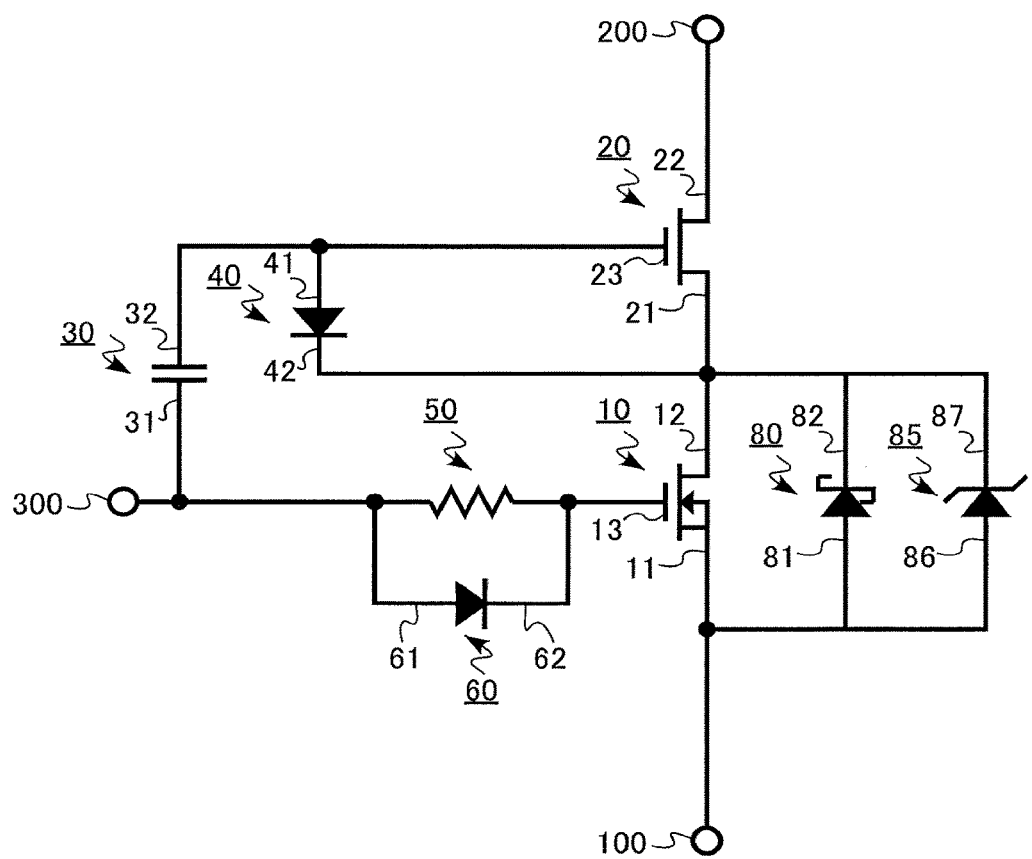
FIG. 8 is a circuit diagram of a semiconductor device according to a seventh embodiment.

FIG. 8 is a circuit diagram of the semiconductor device according to the present embodiment. The semiconductor device according to the present embodiment has all of the configurations of the first, third, fourth, fifth, and sixth embodiments, thereby realizing the effect obtained by combining the effects of these embodiments.

Eighth Embodiment

The semiconductor device according to the present embodiment is similar to the first embodiment except that it further includes a fifth diode having a fifth anode electrically connected to the first source and having a fifth cathode electrically connected to the second drain. Accordingly, descriptions of the content overlapping with the first embodiment will be omitted.

Figure 9:
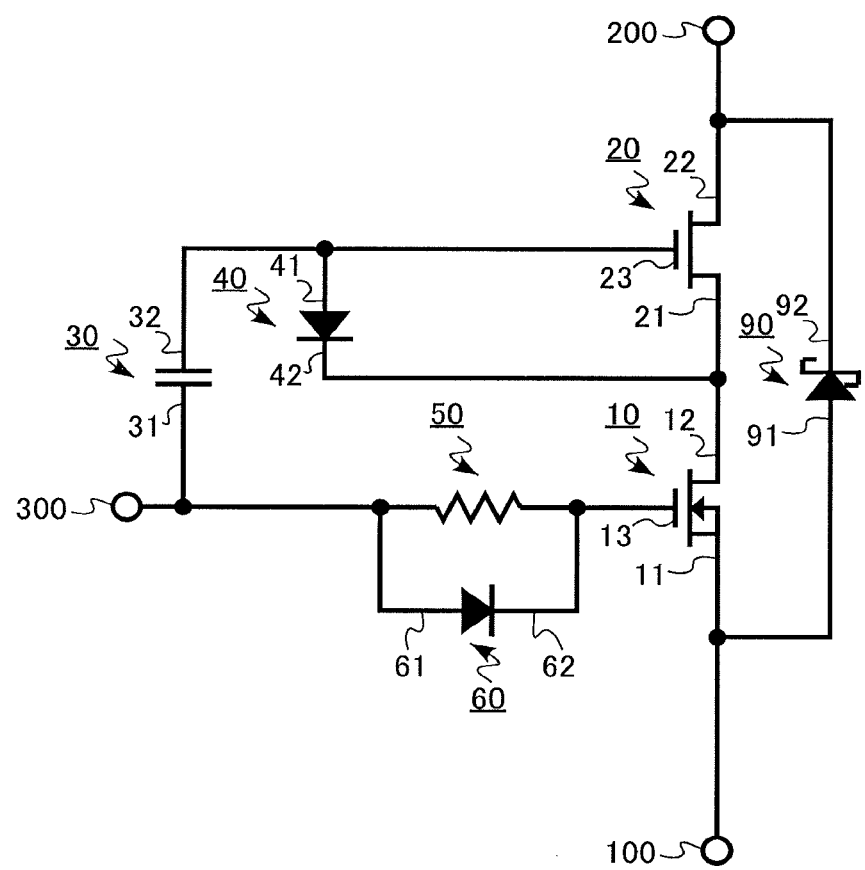
FIG. 9 is a circuit diagram of a semiconductor device according to an eighth embodiment.

FIG. 9 is a circuit diagram of the semiconductor device according to the present embodiment. The normally-off transistor 10 includes a body diode (not illustrated). Note that the normally-on transistor 20 does not include the body diode (parasitic diode).

The semiconductor device includes a fifth diode 90 having a fifth anode 91 connected to the first source 11 and having a fifth cathode 92 connected to the second drain 22. The fifth diode 90 includes a function of applying a current from the source terminal 100 side to the drain terminal 200 side in a case where the voltage of the source terminal 100 is higher than the voltage of the drain terminal 200 (reflux mode). This is also referred to as a reflux diode.

The fifth diode 90 is desirably a diode having better recovery characteristics than the case of the body diode of the normally-off transistor 10. The fifth diode 90 desirably has a shorter recovery time than the case of the body diode of the normally-off transistor 10. The fifth diode 90 is, for example, a PiN diode, and a Schottky barrier diode or a fast recovery diode having excellent recovery characteristics as compared with the PiN diode.

Moreover, it is desirable that the fifth diode 90 is a diode using a wide bandgap semiconductor having a wider bandgap than the bandgap of Si. A diode using a wide bandgap semiconductor can realize higher breakdown voltage than a diode using Si. Examples of wide bandgap semiconductors include GaN-based semiconductors, SiC, and diamond.

The semiconductor device according to the present embodiment suppresses, in the reflux mode, a reflux current flowing through the body diode of the normally-off transistor 10. Then, a reflux current is allowed to flow through a current path including the fifth diode 90.

As the fifth diode 90, a diode having a recovery time shorter than the case of the body diode of the normally-off transistor 10 is used. Thus, according to the present embodiment, a semiconductor device having enhanced recovery characteristics at reflux current flow is realized. Accordingly, for example, with application of the semiconductor device according to the present embodiment as a switching element of an inverter circuit of a motor control system, it is possible to suppress switching loss in the reflux mode.

Moreover, since the divided flow is suppressed, it is possible to suppress instability of the characteristics in the reflux mode even when the temperature environment changes.

As described above, according to the present embodiment, it is possible not only to achieve the effects of the first embodiment but also to achieve a semiconductor device with enhanced recovery characteristics.

Ninth Embodiment

The semiconductor device according to the present embodiment is similar to the first embodiment except that it further includes a sixth diode having a sixth anode electrically connected between the second end and the second gate and having a sixth cathode electrically connected to the first source. Accordingly, descriptions of the content overlapping with the first embodiment will be omitted.

Figure 10:
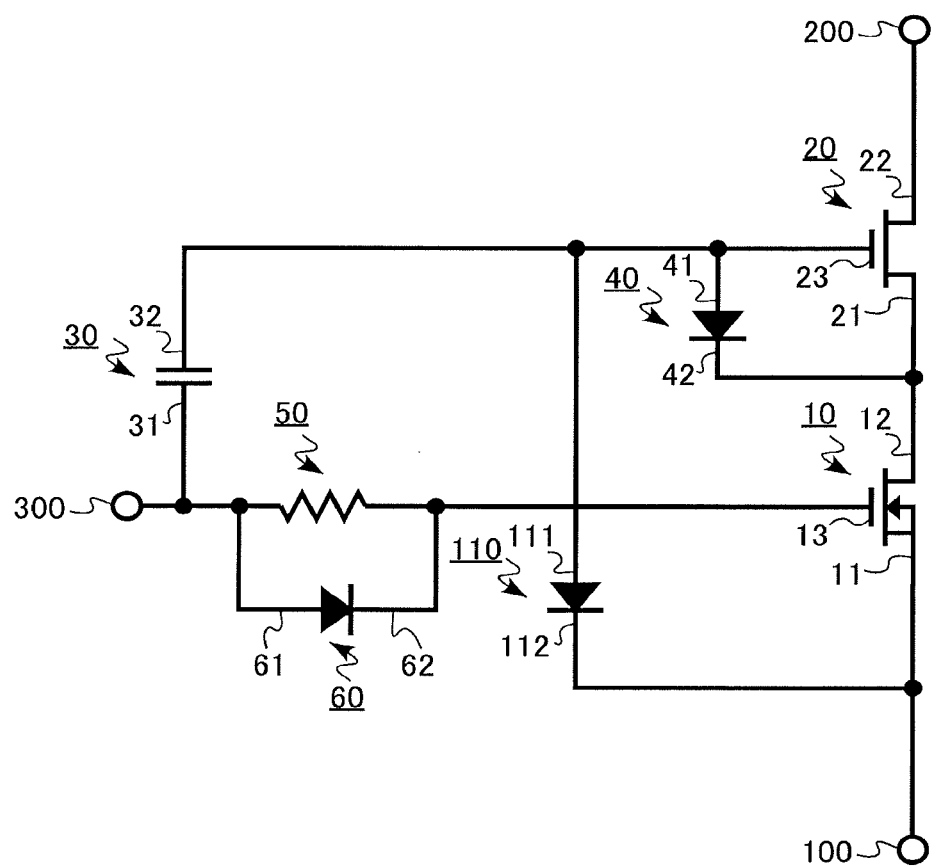
FIG. 10 is a circuit diagram of a semiconductor device according to a ninth embodiment.

FIG. 10 is a circuit diagram of the semiconductor device according to the present embodiment.

The semiconductor device according to the present embodiment includes a sixth diode 110 having a sixth anode 111 electrically connected to the second end 32 of the capacitor 30 and to the second gate 23 of the normally-on transistor 20 and having a sixth cathode 112 electrically connected to the first source 11 of the normally-off transistor 10.

The semiconductor device according to the present embodiment includes the sixth diode 110, thereby suppressing the breakdown of the semiconductor device that might occur when the semiconductor device is in the off state for a long time and thus, enhancing the reliability.

Hereinafter, a function and an effect according to the present embodiment will be described. FIGS. 11 to 14 are diagrams illustrating a function and an effect of the semiconductor device according to the present embodiment.

Figure 11:
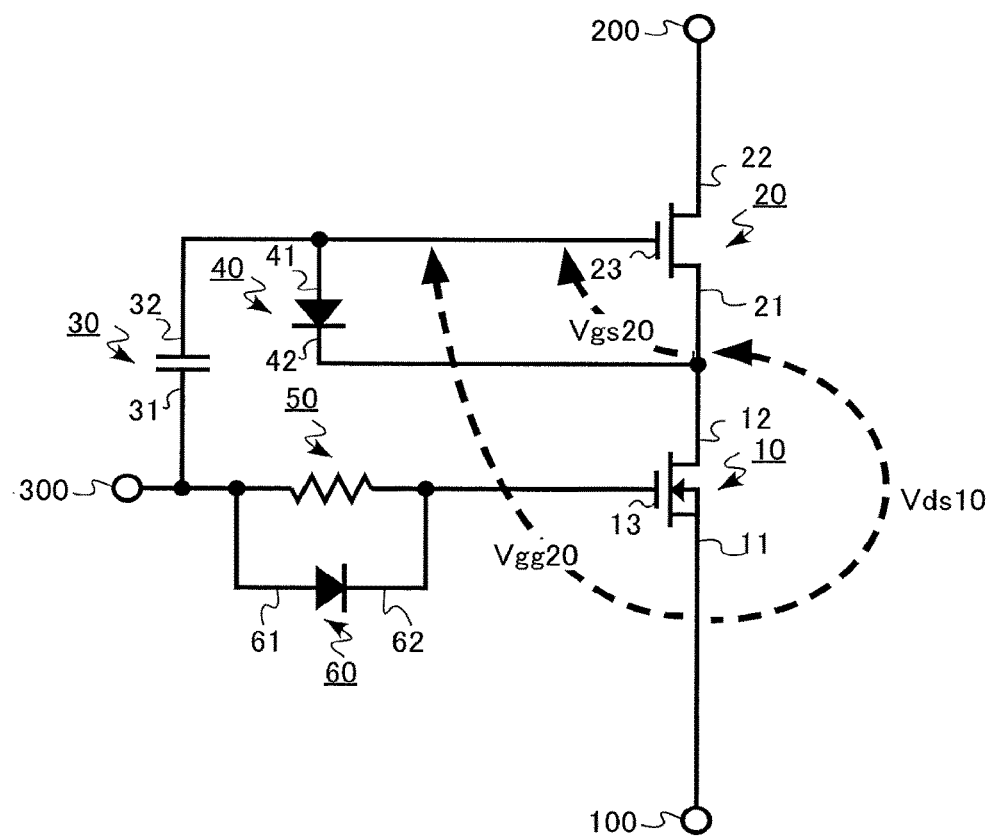
FIG. 11 is an illustration of a function and an effect of the semiconductor device of the ninth embodiment.
Figure 12:
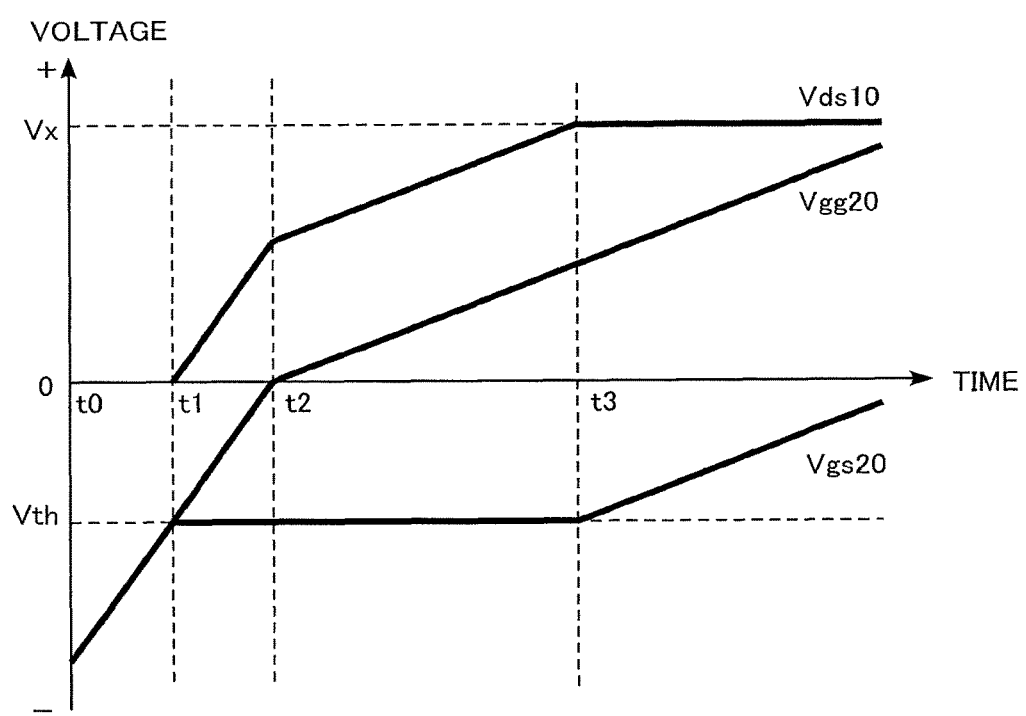
FIG. 12 is an illustration of a function and an effect of the semiconductor device of the ninth embodiment.

FIG. 11 is a circuit diagram of the semiconductor device of the first embodiment. FIG. 12 illustrates a temporal change in the potential of the second gate 23 of the normally-on transistor 20 when the semiconductor device of the first embodiment illustrated in FIG. 11 is in the off state, and illustrates a temporal change in the first drain 12 voltage of the normally-off transistor 10.

In FIG. 12, the potential of the second gate 23 based on the second source 21 is denoted by Vgs 20. Moreover, the potential of the second gate 23 based on the first source 11 is denoted as Vgg 20. Vgg 20 can also be referred to as being based on the source terminal 100.

In FIG. 12, the potential of the first drain 12 of the normally-off transistor 10 is denoted by Vds 10. In other words, the potential of the first drain 12 of the normally-off transistor 10 is the potential of the second source 21 of the normally-on transistor 20. The relationship is represented by: Vgs 20=Vgg 20−Vds 10.

When the semiconductor device is in the off state, the potentials Vgs 20 and Vgg 20 of the second gate 23 are negative voltages lower than the threshold voltage Vth of the normally-on transistor 20. When the time elapses in the off state, the potential of the second gate 23 starts to increase due to the leakage current, as in the period between time t0 and time t1 in FIG. 12.

When the potentials Vgs 20 and Vgg 20 of the second gate 23 reach the threshold voltage Vth at time t1, channel leakage of the normally-on transistor 20 starts to occur. Accordingly, the potential Vds 10 of the first drain 12 starts to increase.

When the potential Vds 10 of the first drain 12 increases, the potential Vgs 20 of the second gate 23 of the normally-on transistor 20 decreases. For this reason, channel leakage is suppressed. Accordingly, even when the channel leakage of the normally-on transistor 20 occurs and the potential Vds 10 of the first drain 12 starts to increase, the potential Vgs 20 of the second gate 23 is kept at the threshold voltage Vth. Accordingly, the normally-on transistor 20 is kept in the off state.

On the other hand, the potential Vgg 20 of the second gate 23 based on the first source 11 continues to increase due to the leakage current. Then, the potential Vgg 20 of the second gate 23 continues to increase due to the leakage current even after reaching 0 V at the time t2. The potential Vds 10 of the first drain 12 also continues to increase from time t2.

Thereafter, at time t3, the potential Vds 10 of the first drain 12 reaches, for example, an avalanche breakdown voltage Vx of the normally-off transistor 10. In this case, due to the avalanche current flow, the potential Vds 10 of the first drain 12 is fixed at Vx.

Since the potential Vgg 20 of the second gate 23 continues to increase, the potential Vgs 20 of the second gate 23 exceeds the threshold voltage Vth, and the normally-on transistor 20 becomes the on state. As a result, the semiconductor device breaks from time t3.

Figure 13:
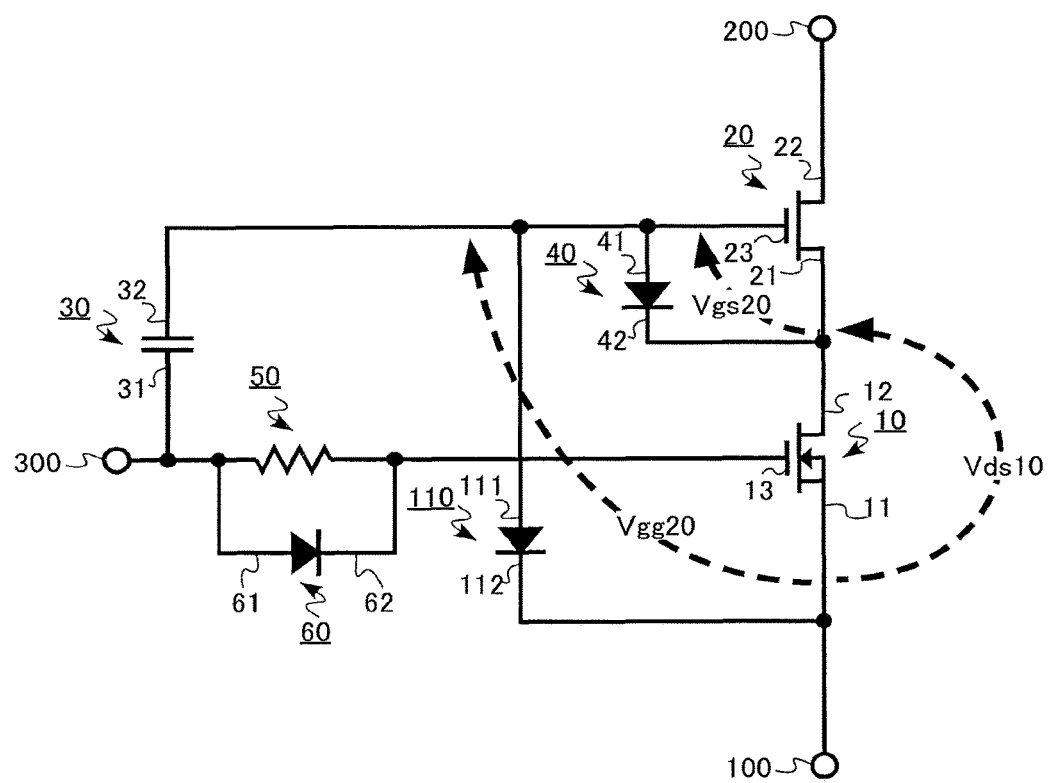
FIG. 13 is an illustration of function and effect of the semiconductor device of the ninth embodiment.
Figure 14:
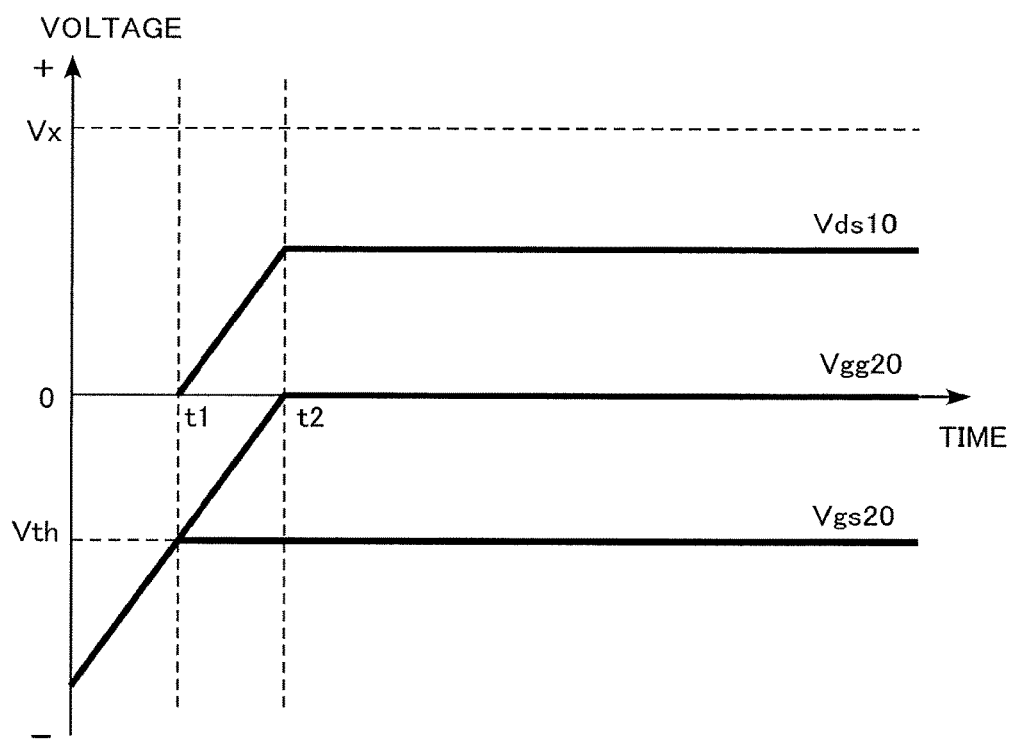
FIG. 14 is an illustration of a function and an effect of the semiconductor device of the ninth embodiment.

FIG. 13 is a circuit diagram of the semiconductor device according to the present embodiment. FIG. 14 is a graph illustrating a temporal change in the potential of the second gate 23 of the normally-on transistor 20 when the semiconductor device of the present embodiment illustrated in FIG. 13 is in the off state, and a temporal change in the first drain 12 of the normally-off transistor 10.

The semiconductor device according to the present embodiment includes the sixth diode 110 in addition to the configuration of the semiconductor device of the first embodiment. Accordingly, when the potential Vgg 20 of the second gate 23 exceeds 0 V and reaches a forward drop voltage of the sixth diode 110 at the time t2, a positive charge is released from the second gate 23 to the first source 11. Accordingly, the increase in the potential Vgg 20 of the second gate 23 stops in the vicinity of 0 V.

Since the increase in the potential Vgg 20 of the second gate 23 stops, the potential Vgs 20 of the second gate 23 is kept at the threshold voltage Vth. Accordingly, the normally-on transistor 20 is kept in the off state. As a result, breakdown of the semiconductor device is suppressed even when the apparatus is in an off state for a long time.

Note that, a PiN diode or a Schottky barrier diode can be used, for example, as the sixth diode 110. From the viewpoint of suppressing the leakage current to the second gate 23, it is desirable to use the PiN diode having a relatively small leakage current at the time of reverse bias.

According to the present embodiment, breakdown of the semiconductor device that might occur when the semiconductor device is in the off state for a long time is suppressed, and thus, reliability is enhanced in addition to achieving the effects of the first embodiment.

Tenth Embodiment

The semiconductor device according to the present embodiment is similar to the ninth embodiment, except that it further includes, instead of the sixth diode, a fourth resistor electrically connected between the second gate and the first source. Accordingly, descriptions of the content overlapping with the ninth embodiment will be omitted.

Figure 15:
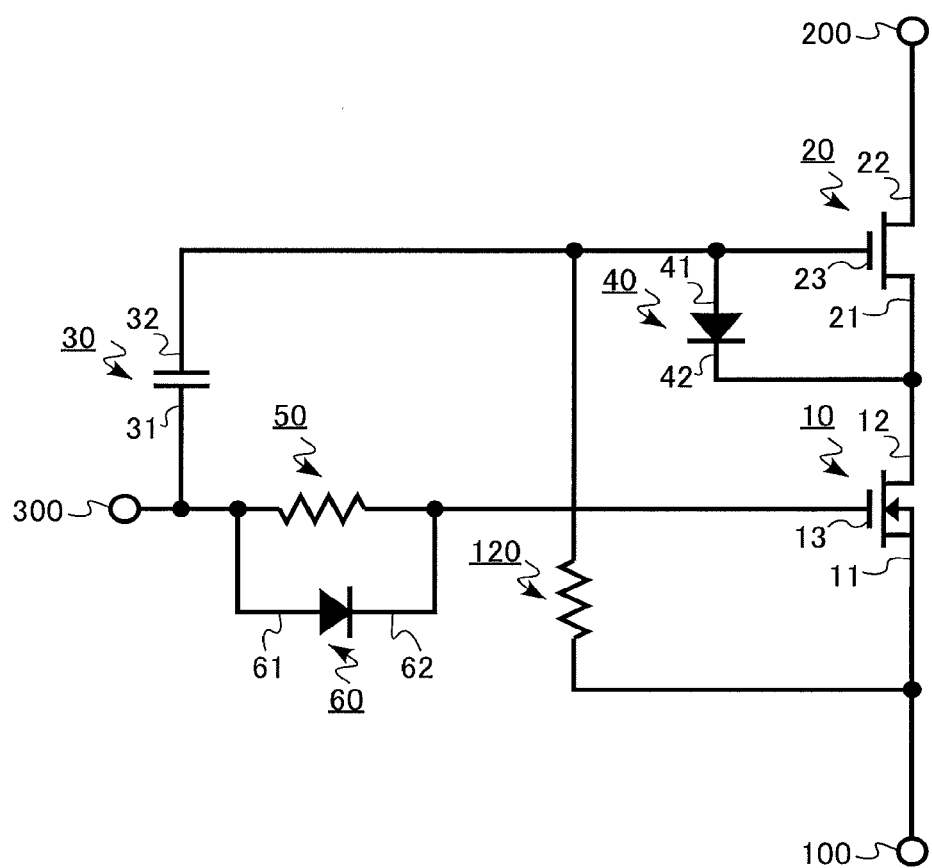
FIG. 15 is a circuit diagram of a semiconductor device according to a tenth embodiment.

FIG. 15 is a circuit diagram of the semiconductor device according to the present embodiment.

The semiconductor device according to the present embodiment includes a fourth resistor 120 electrically connected between the second gate 23 of the normally-on transistor 20 and the first source 11 of the normally-off transistor 10.

The semiconductor device according to the present embodiment is configured such that, in a case where the semiconductor device is in the off state for a long time and the potential Vgg 20 of the second gate 23 exceeds 0 V, a positive charge is released from the second gate 23 to the first source 11 via the fourth resistor 120. Accordingly, the increase in the potential Vgg 20 of the second gate 23 stops in the vicinity of 0 V.

According to the present embodiment, similarly to the ninth embodiment, breakdown of the semiconductor device is suppressed and reliability is enhanced even when the apparatus is in an off state for a long time. Moreover, by using an electric resistance that is inexpensive compared with a diode, it is possible to reduce the cost of the semiconductor device.

Eleventh Embodiment

The semiconductor device according to the present embodiment is similar to the ninth embodiment except that it further includes, instead of the sixth diode, a seventh diode having a seventh anode electrically connected between the second end and the second gate and having a seventh cathode electrically connected to the first end. Accordingly, descriptions of the content overlapping with the ninth embodiment will be omitted.

Figure 16:
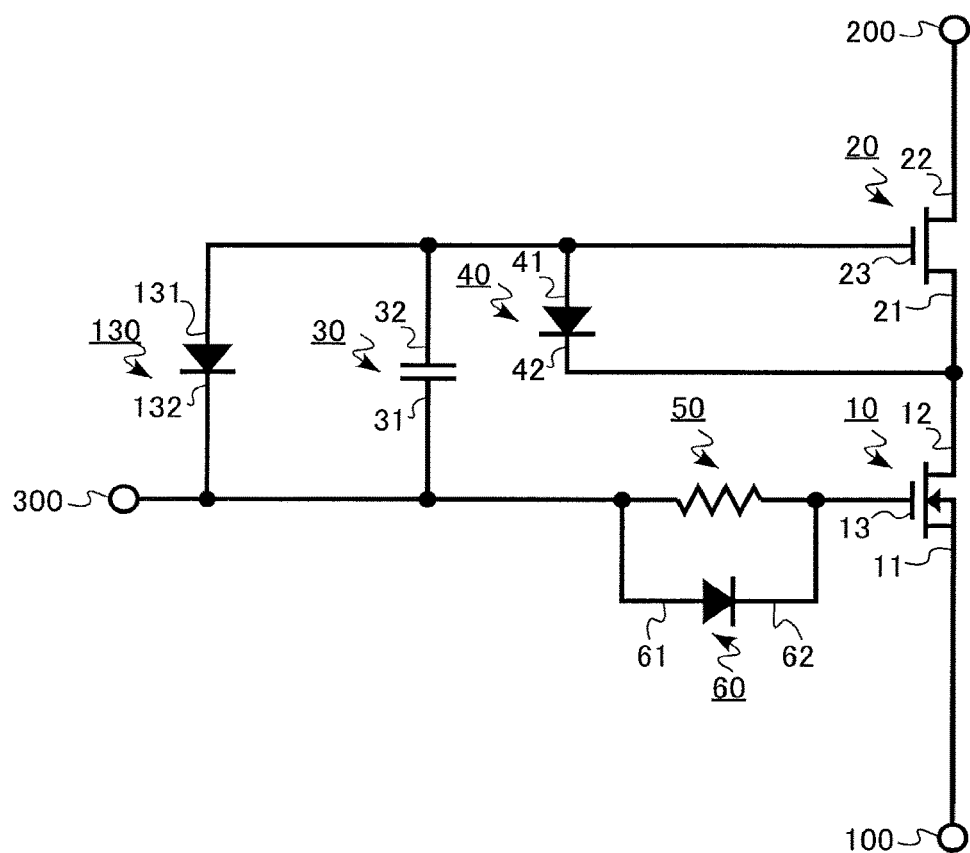
FIG. 16 is a circuit diagram of a semiconductor device according to an eleventh embodiment.

FIG. 16 is a circuit diagram of the semiconductor device according to the present embodiment.

The semiconductor device according to the present embodiment includes a seventh diode 130 having a seventh anode 131 electrically connected to the second end 32 of the capacitor 30 and the second gate 23 of the normally-on transistor 20 and having a seventh cathode 132 electrically connected to the first end 31 of capacitor 30. In other words, the apparatus includes the seventh diode 130 electrically connected in parallel with the capacitor 30.

The semiconductor device according to the present embodiment is configured such that, in a case where the semiconductor device is in the off state for a long time and the potential Vgg 20 of the second gate 23 exceeds 0 V and reaches a forward drop voltage of the seventh diode 130, a positive charge is released from the second gate 23 to the gate terminal 300 fixed at 0 V. Accordingly, the increase in the potential Vgg 20 of the second gate 23 stops in the vicinity of 0 V.

According to the present embodiment, similarly to the ninth embodiment, breakdown of the semiconductor device is suppressed and reliability is enhanced even when the apparatus is in an off state for a long time.

Twelfth Embodiment

The semiconductor device according to the present embodiment is similar to the ninth embodiment, except that it further includes, instead of the sixth diode, a fifth resistor electrically connected between the second end and the first end. Accordingly, descriptions of the content overlapping with the ninth embodiment will be omitted.

Figure 17:
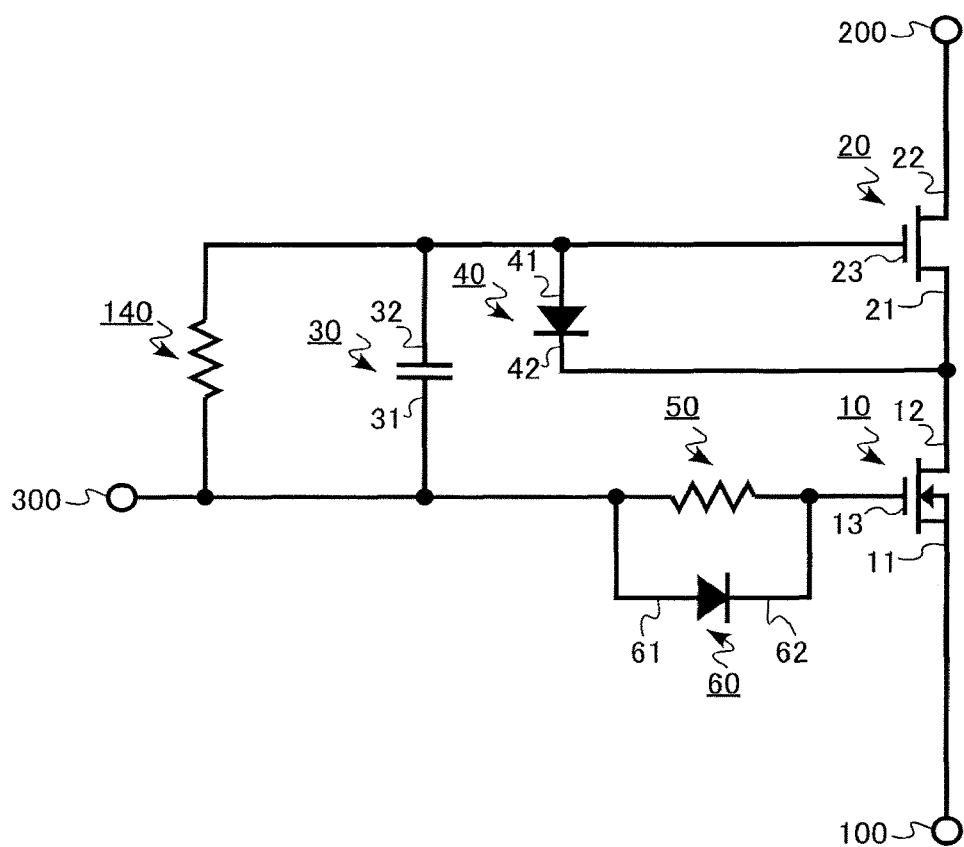
FIG. 17 is a circuit diagram of a semiconductor device according to a twelfth embodiment.

FIG. 17 is a circuit diagram of the semiconductor device according to the present embodiment.

The semiconductor device according to the present embodiment includes a fifth resistor 140 electrically connected between the second end 32 and the first end 31 of the capacitor 30. In other words, the apparatus includes the fifth resistor 140 electrically connected in parallel with the capacitor 30.

The semiconductor device according to the present embodiment is configured such that, in a case where the semiconductor device is in the off state for a long time and the potential Vgg 20 of the second gate 23 exceeds 0 V, a positive charge is released from the second gate 23 to the gate terminal 300 fixed at 0 V via the fifth resistor 140. Accordingly, the increase in the potential Vgg 20 of the second gate 23 stops in the vicinity of 0 V.

According to the present embodiment, similarly to the ninth embodiment, breakdown of the semiconductor device is suppressed and reliability is enhanced even when the apparatus is in an off state for a long time. Moreover, by using an electric resistance that is inexpensive compared with a diode, it is possible to reduce the cost of the semiconductor device.

Thirteenth Embodiment

The semiconductor device according to the present embodiment is similar to the ninth embodiment except that it includes a Zener diode having a fourth anode electrically connected to the first source and having a fourth cathode electrically connected to the first drain. The Zener diode is configured such that a Zener voltage is lower than the breakdown voltage between the second source and the second gate of the normally-on transistor and the Zener voltage is lower than the avalanche breakdown voltage of the normally-off transistor. Accordingly, descriptions of the content overlapping with the ninth embodiment will be omitted.

Figure 18:
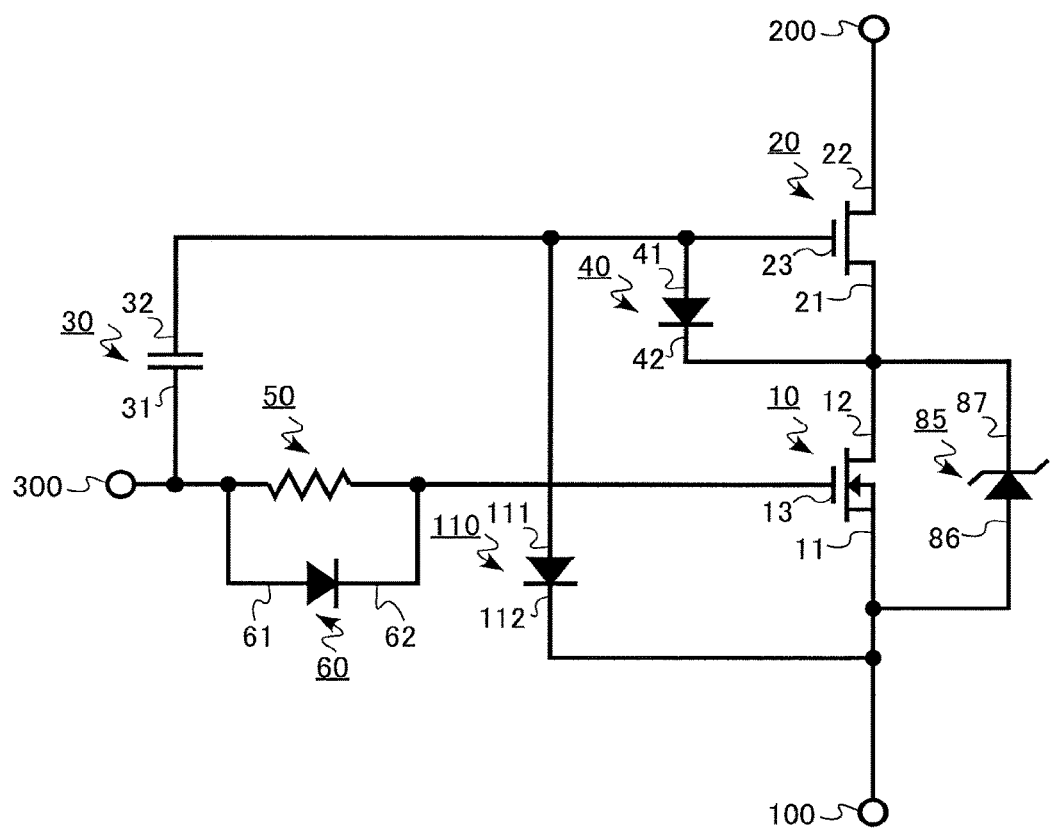
FIG. 18 is a circuit diagram of a semiconductor device according to a thirteenth embodiment.

FIG. 18 is a circuit diagram of the semiconductor device according to the present embodiment. The semiconductor device according to the present embodiment includes a Zener diode 85 provided in parallel with the normally-off transistor 10.

The Zener diode 85 includes a fourth anode 86 and a fourth cathode 87. The fourth anode 86 is electrically connected to the first source 11. Moreover, the fourth cathode 87 is electrically connected to the first drain 12 and the second source 21.

The Zener voltage of the Zener diode 85 is set to be lower than the avalanche breakdown voltage of the normally-off transistor 10. Moreover, the Zener voltage is set to be lower than the breakdown voltage of the gate insulating film of the normally-on transistor 20. With this arrangement, the breakdown voltage between the first source 11 and the first drain 12 at turn-off of the normally-off transistor 10 is set to a voltage lower than a breakdown voltage between the second source 21 and the second gate 23 of the normally-on transistor 20.

The semiconductor device according to the present embodiment is configured such that, in a case where an over voltage due to a surge, or the like, occurs at the connecting portion of the normally-off transistor 10 and the normally-on transistor 20, the charge is released to the Zener diode 85 and then discharged to the source terminal 100 at a point where the over voltage reaches the Zener voltage. Accordingly, this suppresses voltage increase in the connecting portion and prevents an increase in the leakage current of the gate insulating film of the normally-on transistor 20 and breakdown of the gate insulating film. This also prevents current collapse. As a result, reliability of the semiconductor device is enhanced.

The Zener voltage of the Zener diode 85 can be controlled more accurately than the avalanche breakdown voltage of the normally-off transistor 10. Accordingly, by using the Zener diode 85, the semiconductor device according to the present embodiment makes it possible to suppress the over voltage in the connecting portion further stably. Moreover, even in a case where an unexpected high voltage such as noise is applied to the first drain 12 of the normally-off transistor 10, it is possible to release the charge by the Zener diode 85, and thus to contribute also to protection of the normally-off transistor 10.

According to the present embodiment, similarly to the ninth embodiment, breakdown of the semiconductor device is suppressed and reliability is enhanced even when the apparatus is in an off state for a long time. Moreover, an increase in the leakage current of the gate insulating film of the normally-on transistor 20, breakdown of the gate insulating film, and current collapse are prevented, and the reliability of the semiconductor device is enhanced.

Fourteenth Embodiment

The semiconductor device according to the present embodiment is a power module corresponding to the circuit diagram of the semiconductor device of the sixth embodiment.

Figure 19A:
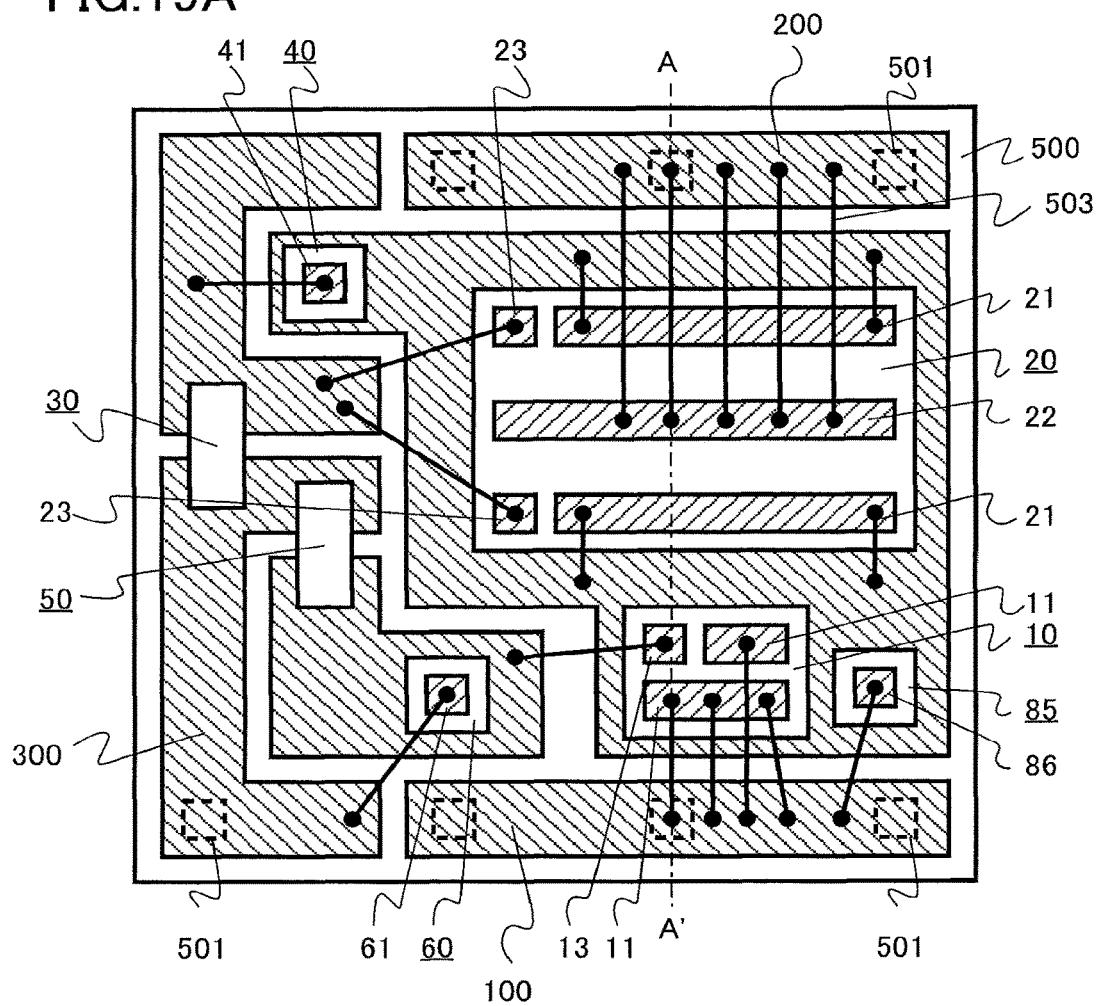
FIGS. 19A, 19B are a schematic diagram of a semiconductor device according to a fourteenth embodiment.
Figure 19B:
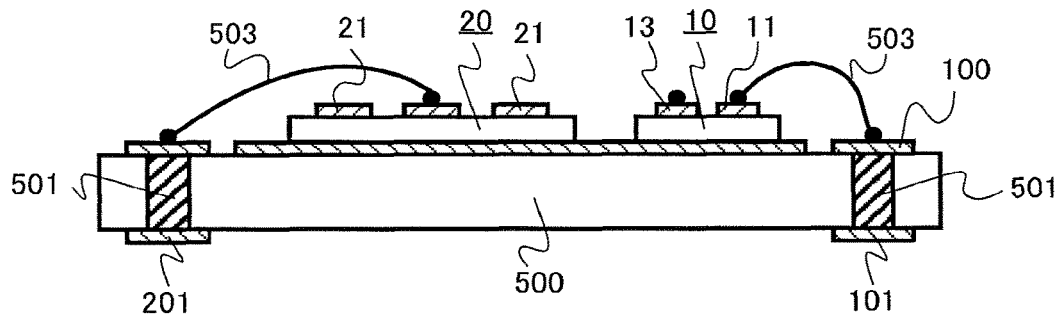

FIG. 19A, 19B is a schematic diagram of the semiconductor device according to the present embodiment. FIG. 19A is a schematic top view, and FIG. 19B is a cross-sectional view taken along AA' of FIG. 19A. The semiconductor device according to the present embodiment is a power module including electronic components such as semiconductor chips being mounted on a mounting substrate.

As electronic components, the normally-off transistor 10, the normally-on transistor 20, the capacitor 30, the first diode 40, the first resistor 50, the second diode 60, and the Zener diode 85 are mounted on a surface of a mounting substrate 500. The mounting substrate 500 includes, on a surface thereof, a surface source terminal 100, a surface drain terminal 200, and a surface gate terminal 300.

The power module according to the present embodiment is mounted on the basis of the circuit diagram of the semiconductor device of the sixth embodiment illustrated in FIG. 7. For example, wire bonding 503 is used to electrically connect the electronic components with each other, and connect each of the electronic components with the source terminal 100, the drain terminal 200, and the gate terminal 300.

The mounting substrate 500 includes, on a backside thereof, a backside source terminal 101, a backside drain terminal 201, and a backside gate terminal. The surface source terminal 100 and the backside source terminal 101, the surface drain terminal 200 and the backside drain terminal 201, and the surface gate terminal 300 and the backside gate terminal are electrically connected via a through-via 501 provided within the mounting substrate 500. The semiconductor module can be mounted on a circuit board, or the like, using the backside source terminal 101, the backside drain terminal 201, and the backside gate terminal.

With the power module according to the present embodiment, reliability of the normally-off transistor 10 and the normally-on transistor 20 connected in series can be enhanced.

While certain embodiments have been described, these embodiments have been presented by way of example only, and are not intended to limit the scope of the inventions. Indeed, semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a normally-off transistor having a first source, a first drain, and a first gate;
   a normally-on transistor having a second source electrically connected to the first drain, a second drain, and a second gate;
   a capacitor having a first end and a second end, the second end being electrically connected to the second gate;
   a first diode having a first anode electrically connected between the second end and the second gate and having a first cathode electrically connected to the second source;
   a first resistor provided between the first end and the first gate; and
   a second diode having a second anode electrically connected to the first end and having a second cathode electrically connected to the first gate, the second diode being provided in parallel with the first resistor.

2. The semiconductor device according to claim 1, wherein the normally-on transistor is a high electron mobility transistor (HEMT) using a GaN-based semiconductor.

3. The semiconductor device according to claim 1, wherein capacitance of the capacitor is 10 times or more of input capacitance of the normally-on transistor.

4. The semiconductor device according to claim 1, wherein the first diode is a Schottky barrier diode.

5. The semiconductor device according to claim 1, wherein the normally-off transistor is a vertical metal oxide semiconductor field effect transistor (MOSFET) using silicon (Si).

6. The semiconductor device according to claim 1, wherein a product of input capacitance of the normally-off transistor and a resistance value of the first resistor is larger than 20 nsec.

7. The semiconductor device according to claim 1, wherein a product of input capacitance of the normally-off transistor and a resistance value of the first resistor is larger than 100 nsec.

8. The semiconductor device according to claim 1, further comprising a second resistor having one end being electrically connected between the first end and the first resistor.

9. The semiconductor device according to claim 1, further comprising a third resistor provided between the second end and the second gate.

10. The semiconductor device according to claim 1, further comprising a Schottky barrier diode having a third anode electrically connected to the first source and having a third cathode electrically connected to the first drain, the Schottky barrier diode being configured such that a forward drop voltage is lower than a forward drop voltage of a parasitic body diode of the normally-off transistor.

11. The semiconductor device according to claim 1, further comprising a Zener diode having a fourth anode electrically connected to the first source and having a fourth cathode electrically connected to the first drain, the Zener diode being configured such that a Zener voltage is lower than a breakdown voltage between the second source and the second gate of the normally-on transistor and the Zener voltage is lower than an avalanche breakdown voltage of the normally-off transistor.

12. The semiconductor device according to claim 1, further comprising a fifth diode having a fifth anode electrically connected to the first source and having a fifth cathode electrically connected to the second drain.

13. The semiconductor device according to claim 1, further comprising a sixth diode having a sixth anode electrically connected between the second end and the second gate and having a sixth cathode electrically connected to the first source.

14. The semiconductor device according to claim 1, further comprising a fourth resistor electrically connected between the second gate and the first source.

15. The semiconductor device according to claim 1, further comprising a seventh diode having a seventh anode electrically connected between the second end and the second gate and having a seventh cathode electrically connected to the first end.

16. The semiconductor device according to claim 1, further comprising a fifth resistor electrically connected between the second end and the first end.

* * * * *